United States Patent
Nakajima et al.

(10) Patent No.: US 6,835,986 B2
(45) Date of Patent: Dec. 28, 2004

(54) LIQUID CRYSTAL DISPLAY DEVICE AND MANUFACTURING METHOD THEREOF

(75) Inventors: Setsuo Nakajima, Atsugi (JP); Naoki Makita, Osaka (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/822,462

(22) Filed: Apr. 2, 2001

(65) Prior Publication Data

US 2001/0025992 A1 Oct. 4, 2001

(30) Foreign Application Priority Data

Apr. 3, 2000  (JP) .................................... 2000-101576

(51) Int. Cl.$^7$ ..................... H01L 29/76; H01L 31/109
(52) U.S. Cl. .................. 257/371; 257/351; 257/369; 257/59; 257/72; 257/24
(58) Field of Search ................. 257/351, 371, 257/369, 59, 72, 24, 57, 20, 27, 66

(56) References Cited

U.S. PATENT DOCUMENTS

| | | | |
|---|---|---|---|
| 5,583,369 A | * | 12/1996 | Yamazaki et al. ......... 257/635 |
| 5,643,826 A | | 7/1997 | Ohtani et al. |
| 5,753,560 A | | 5/1998 | Hong et al. |
| 5,923,962 A | | 7/1999 | Ohtani et al. |
| 5,981,974 A | * | 11/1999 | Makita ......................... 257/72 |
| 5,990,542 A | * | 11/1999 | Yamazaki ................... 257/642 |
| 6,040,589 A | | 3/2000 | Zhang et al. |
| 6,331,718 B1 | * | 12/2001 | Yamazaki et al. ............ 257/64 |
| 6,459,124 B1 | | 10/2002 | Zhang et al. |
| 6,528,360 B2 | | 3/2003 | Zhang et al. |

FOREIGN PATENT DOCUMENTS

| | | |
|---|---|---|
| JP | 07-130652 | 5/1995 |
| JP | 11-054760 | 2/1999 |

* cited by examiner

Primary Examiner—Jerome Jackson
Assistant Examiner—Joseph Nguyen
(74) Attorney, Agent, or Firm—Eric J. Robinson; Robinson Intellectual Property Law Office, P.C.

(57) ABSTRACT

To manufacture a liquid crystal display device with high thin film transistor accumulation, high productivity and high reliability by efficiently gettering a catalyst element, which promotes crystallization of an amorphous silicon film, from a channel region. In order to solve the above object, a step of providing a gettering sink on the outside of a p-channel thin film transistor region, and a step of removing a region provided on the outside of the thin film transistor region within the region where the catalyst element is gettered in a self-aligning manner by a source wiring or a drain wiring, are combined.

36 Claims, 8 Drawing Sheets

P-channel type TFT

P-channel type TFT

P-channel type TFT    N-channel type TFT

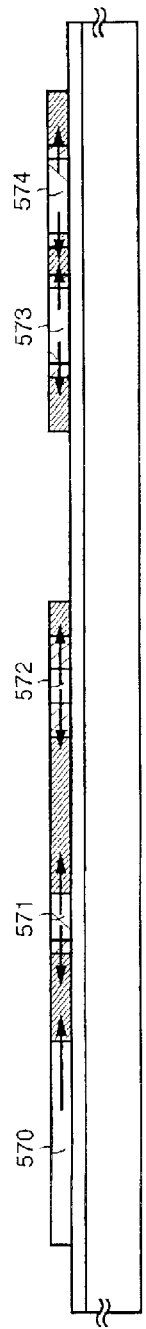
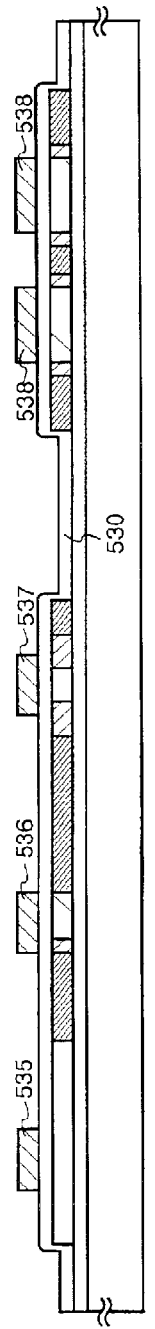
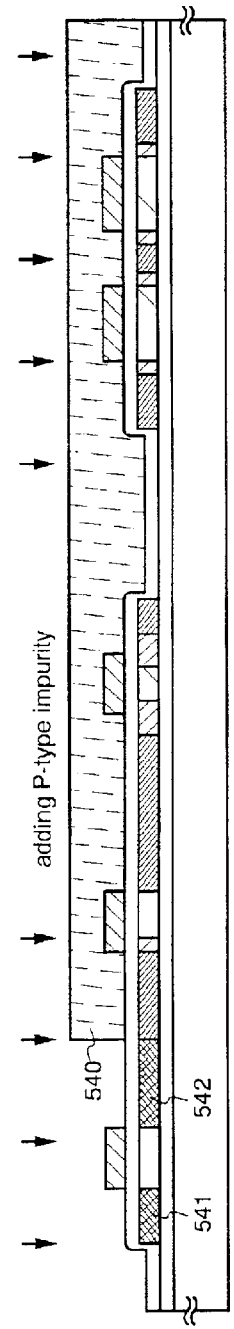
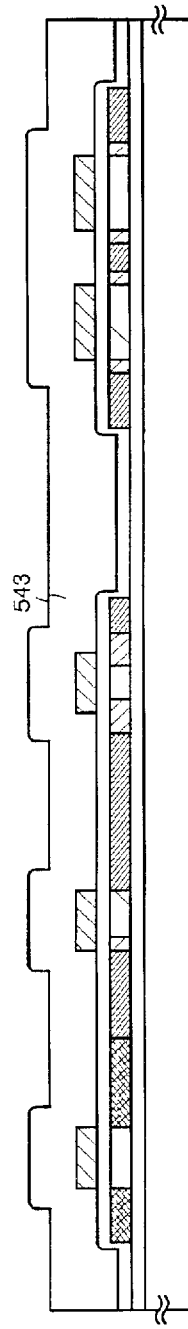
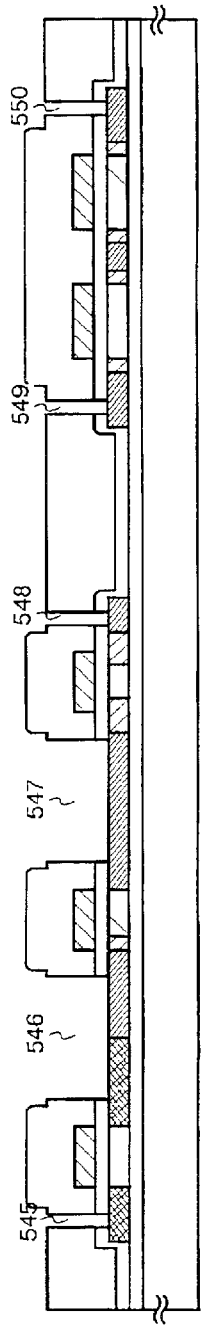

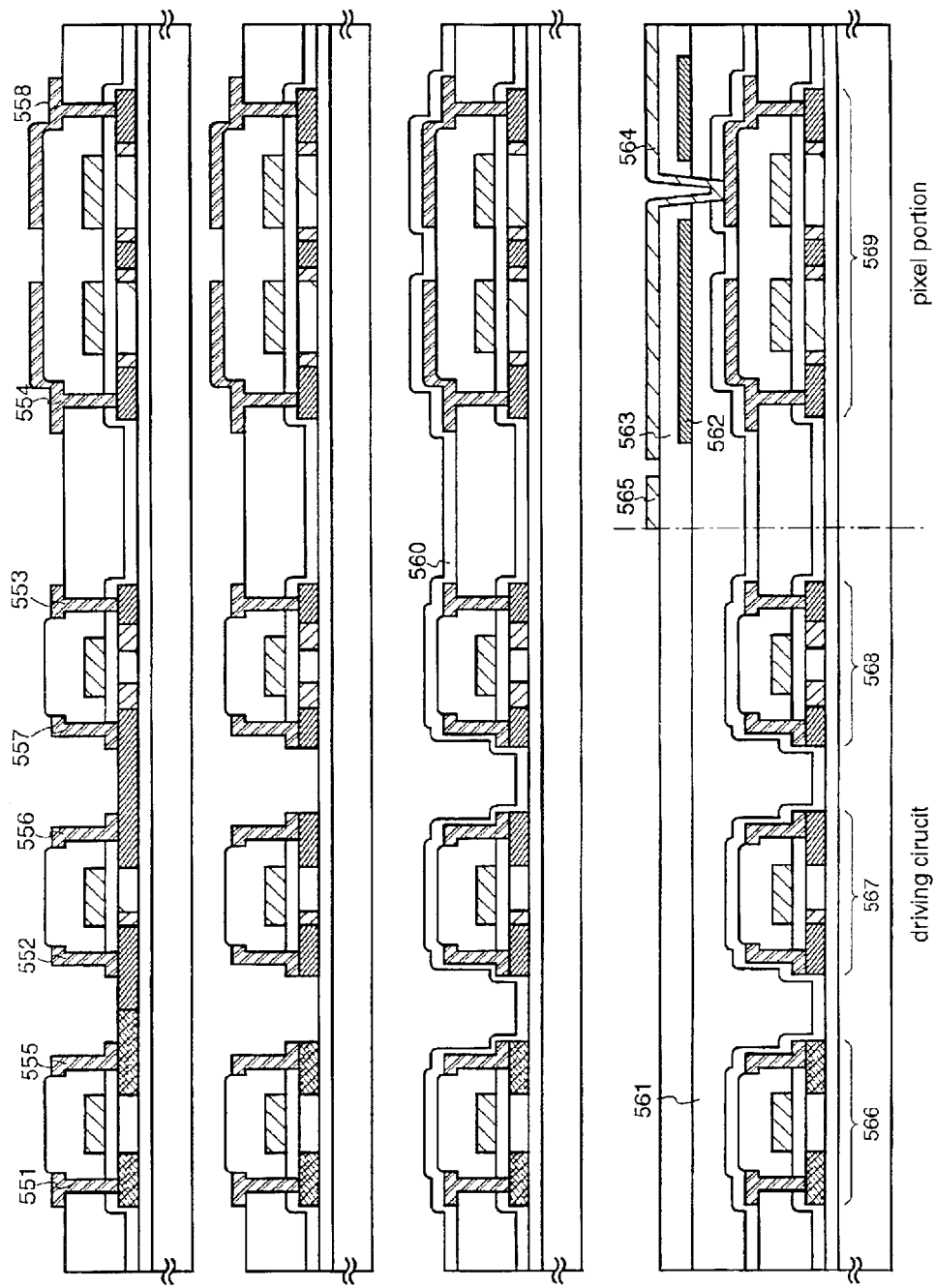

500:glass substrate 1006:pixel portion 1007:gate signal line driver circuit 1008: source signal line driver circuit 1009:FPC 1010:input terminal portion 1011, 1012:connection wiring 569:pixel TFT 538:gate wiring 554:source wiring 564:pixel electrode 1014:storage capacitor 1002:opposing substrate

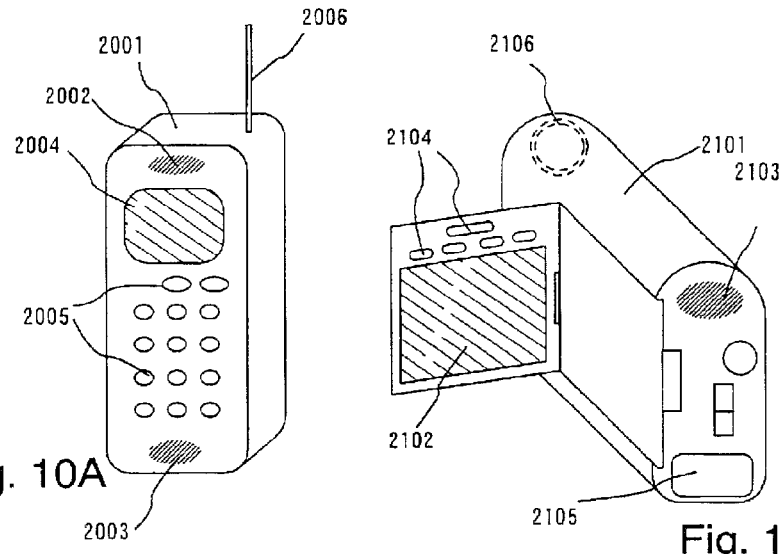
Fig. 10A
Fig. 10B
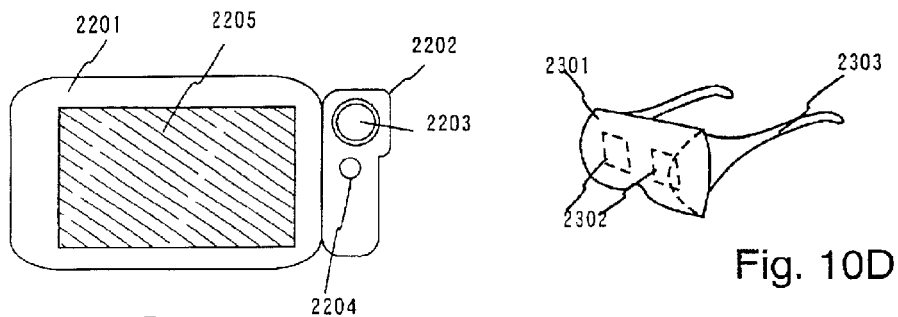
Fig. 10C
Fig. 10D
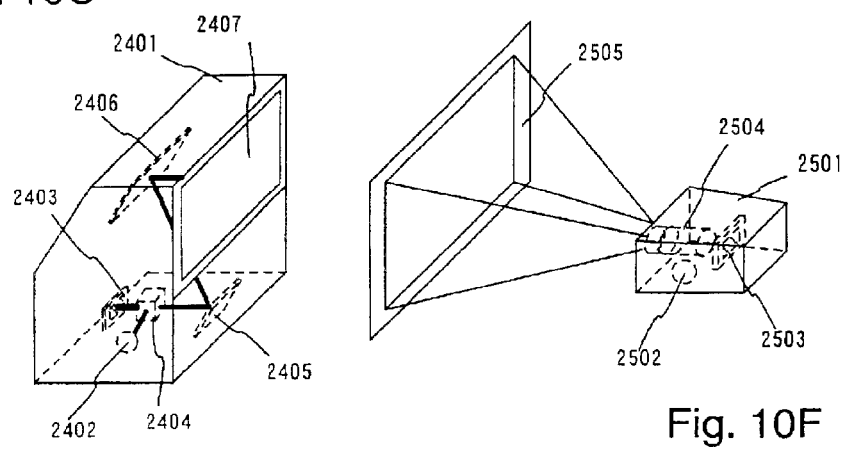
Fig. 10E
Fig. 10F

LIQUID CRYSTAL DISPLAY DEVICE AND MANUFACTURING METHOD THEREOF

BACKGROUND OF THE INVENTION

1. Field of the Invention

The present invention relates to a manufacturing method of a liquid crystal display device using a crystalline semiconductor film formed by crystallizing an amorphous semiconductor film including silicon, and more particularly, to a manufacturing method of an active matrix substrate with a thin film transistor (TFT) formed on the substrate.

2. Description of the Related Art

Recently, lowering of the temperature in a semiconductor manufacturing process is advancing. The important reason is that there is a need to form a TFT on an insulating substrate such as glass, which is cheap and has high processability. Further, in the semiconductor manufacturing process, it is necessary to crystallize amorphous components contained in a semiconductor material or an amorphous semiconductor material, or to improve crystallinity for high operation speed of the TFT.

A technique for obtaining a crystalline silicon film on a glass substrate is already disclosed as described in Japanese Patent Application Laid-open No. Hei 7-130652. This is a technique of adding a catalyst element which promotes crystallization to an amorphous silicon film and forming the crystalline silicon film by conducting a heating process.

This technique enables lowering of the crystallization temperature of the amorphous silicon film by 50 to 100° C. by the action of the catalyst element, and reducing of the time required for crystallization by ⅕ to ⅒. Further, it is experimentally confirmed that the crystalline silicon film obtained by the technique has an excellent crystallinity.

However, the metal element such as nickel or cobalt used as the catalyst element, forms a deep level in the silicon film to thereby capture a carrier, so that in a case a TFT is manufactured using the obtained crystalline silicon film, it is confirmed that the catalyst element in the active layer of the TFT will segregate irregularly. If the segregated portion is in a channel region (a region where channels are formed) or a high resistant region (for example, a portion which is called an offset region) of a TFT, it becomes a leak path for weak current, and may become a cause of sudden increase of an off current (a current when the TFT is in an off state).

Accordingly, after crystallization, it is preferable that the catalyst element is removed promptly, or reduced to a degree that it does not cause electrical influence. As a means for this, a technique of using the gettering effect may be used.

A technique for removing or reducing the catalyst element by gettering is disclosed in, for example, Japanese Patent Application Laid-open Hei No. 11-54760. In the technique described in Embodiments 1 and 2 in the publication, a gettering region 302 which includes phosphorus and captures the catalyst element (hereinafter referred to as a gettering sink) is provided near the TFT, and this is removed after the catalyst element is gettered.

In this method, the gettering region 302 is provided in the periphery of the TFT semiconductor layer so that the patterning margin is large. On the other hand, there is a problem in that the area efficiency of the semiconductor layer constituting the TFT lowers and the improvement of the accumulation becomes difficult.

On the other hand, the technique in Embodiments 3, 4 and 5 makes a source region and a drain region function as a gettering sink to improve the accumulation.

As shown in FIG. 4, this method is one of providing gettering sinks 403 to 406 in a self-aligning manner with gate wirings 409 and 410 as masks, and there is no need to provide a gettering sink on the outside of regions of TFT 411 or 412, and the area efficiency is not lowered. However, since a large amount of phosphorus for gettering is doped in the source region 403 and the drain region 405 of the p-channel TFT 411, a larger amount of boron needs to be doped in the source region 403 and the drain region 405 for forming the p-type semiconductor.

Therefore, there was also a problem of lowering of throughput in the doping step, or of improvement of crystallinity of the source region and the drain region becoming difficult. The doping for imparting the p-type conductivity for carrier inversion with respect to the region that has been doped by imparting the n-type conductivity is called cross doping or counter doping.

As described above, the gettering process of removing the catalyst element from the channel region is an effective process when manufacturing a TFT using the crystalline silicon film. Therefore, the need to efficiently perform the gettering process is increasing.

SUMMARY OF THE INVENTION

If the gettering sink is provided in the periphery of the TFT, the area efficiency is lowered and the accumulation of the TFT cannot be raised. A first object of the invention is to getter the catalyst element of the channel region without lowering the area efficiency of the semiconductor layer.

Further, when cross doping is conducted in the source region or the drain region of the p-channel TFT for forming a gettering site, the throughput of the doping process is lowered. A second object of the invention is to getter the catalyst element in the channel region without lowering the throughput in the doping process.

Then, by solving both the above first and second objects, a highly reliable liquid crystal display device with high productivity in which the catalyst element is efficiently gettered from the channel region, and the accumulation of TFT is high can be manufactured. Further, at the same time, it is an object to improve the quality and reliability of electrical equipment using the liquid crystal display device, by manufacturing the liquid crystal display device in accordance with the present invention.

In order to solve the above object, the inventors of the present invention considered gettering the catalyst element included in the active layer by a gettering sink provided on the outer side of the TFT region in the p-channel TFT. The TFT region referred to here indicates the region occupied by the source region, the drain region, and the channel region.

If the gettering sink is provided on the outer side of the TFT region, there is no need to conduct cross doping and throughput of the doping process is improved. However, at the same time, by providing the gettering sink on the outer side of the TFT region, a problem in that the area efficiency of the active layer is lowered occurs as described above.

The present inventors considered combining the steps of providing a gettering sink on the outside of the p-channel TFT region, and removing the region provided on the outside of the TFT region in a self-aligning manner by a source wiring or a drain wiring, out of the regions where the catalyst element was performed with gettering. By removing the gettering sink in a self-aligning manner, the alignment margin for patterning is not necessary, so that gettering may be performed without lowering the area efficiency.

As described above, the object of the present invention is to efficiently getter the catalyst element from the inside of the film to the crystalline silicon film crystallized by using the catalyst element, and specifically the present invention relates to the step of selectively adding the element that belongs to the periodic table group 15 and conducting the heating process. The heating process is conducted by furnace annealing (heating process in the electric furnace), and may use heating means such as laser annealing or lamp annealing.

As a catalyst element promoting crystallization, there is used an element, which is selected from the group consisting of Ni (nickel), Co (cobalt), Fe (iron), Pd (palladium), Pt (platinum), Cu (copper) and Au (gold). In the experiment of the present applicant, the most suitable element is determined to be nickel.

Further, in the present invention, the periodic table group 15 elements added when the gettering sink is formed are N (nitrogen), P (phosphorus), As (arsenic), Sb (stibium), and Bi (bismuth), and it is known that phosphorus shows a particularly significant effect, with arsenic following.

BRIEF DESCRIPTION OF THE DRAWINGS

In the accompanying drawings:

FIGS. 6A to 6E are diagrams showing manufacturing steps of a pixel portion of Embodiment 1;

FIGS. 7A to 7D are diagrams showing manufacturing steps of a pixel portion of Embodiment 1;

FIGS. 10A to 10F show examples of electronic equipments.

DETAILED DESCRIPTION OF THE PREFERRED EMBODIMENTS

Figure 1A:
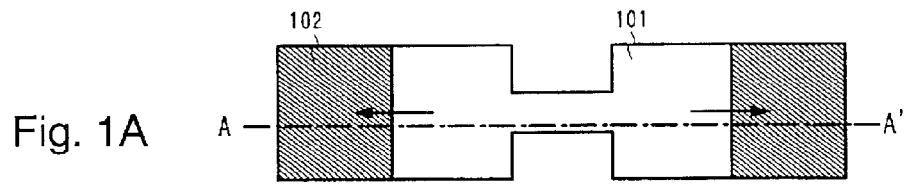
FIGS. 1A to 1F are diagrams explaining a gettering process steps according to the present invention.
Figure 1B:
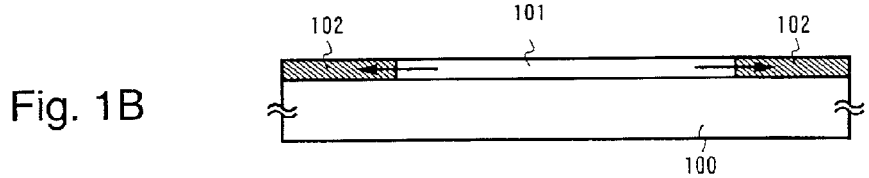

FIGS. 1A to 1F show a structure which embodies the above means. FIGS. 1A to 1F show manufacturing steps of a p-channel TFT. FIG. 1A shows a top view of a gettering process, and FIG. 1B shows a cross sectional view along the line A-A' of FIG. 1A.

First, an active layer 101 is crystallized using a catalyst element, the periodic table group 15 element is added to the adjacent region of the active layer 101 to thereby form gettering sinks 102. Further, the heating process is conducted in a nitrogen atmosphere to getter the catalyst element included in the active layer 101 to the gettering sinks 102 (FIG. 1B).

Figure 1C:
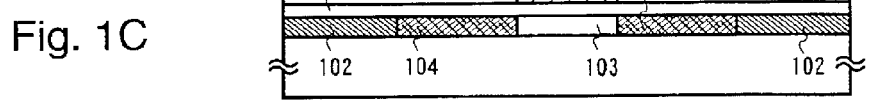
Figure 1D:
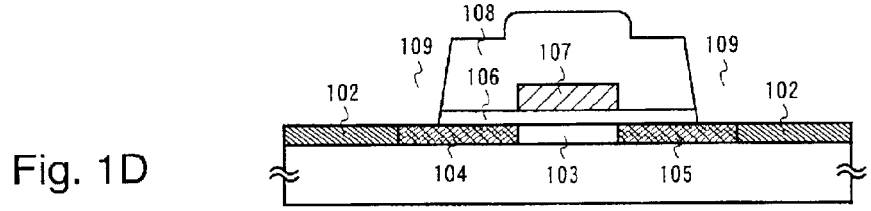

Next, as shown in FIG. 1C, a gate insulating film 106, a gate wiring 107 and a first interlayer insulating film 108 are formed. At this time, in the active layer 101 are formed with a well-known method, a channel region 103, a source region 104, and a drain region 105. Further, the first interlayer insulating film 108 and the gate insulating film 106 are etched, and through-holes (opening portions) 109 for electrical contact to the source region and the drain region are formed (FIG. 1D).

Figure 1E:
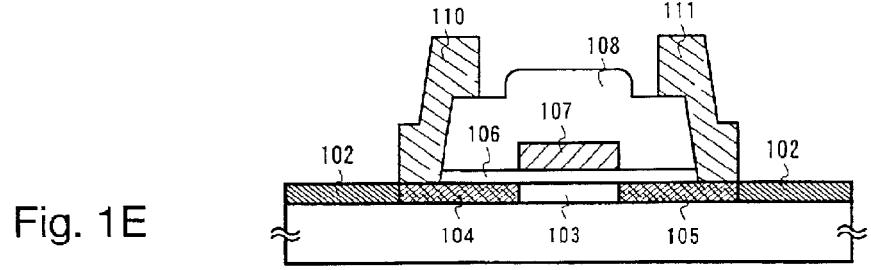
Figure 1F:
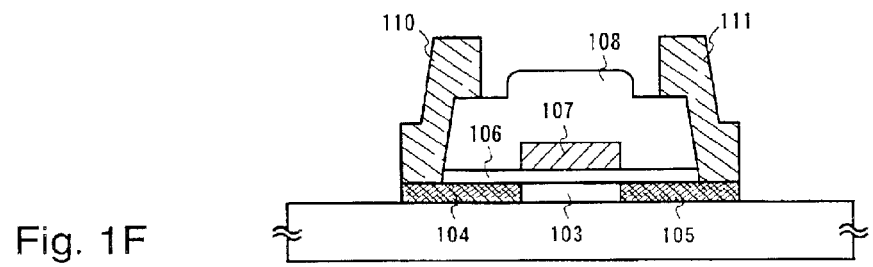

Further, a source wiring 110 and a drain wiring 111 are formed (FIG. 1E). The gettering sinks 102 is etched in a self-aligning manner with the source wiring 110 and the drain wiring 111 as masks, and removed (FIG. 1F).

By removing the gettering sinks 102 in a self-aligning manner, the area efficiency is maintained while performing gettering. Additionally, since the cross-doping step is unnecessary, throughput of the doping step may be improved. Further, in this structure, the gettering sinks 102 are formed on both sides of the active layer 101 (TFT region). However, it is possible to form the gettering sink at only one side in view of the area efficiency.

Figure 2A:
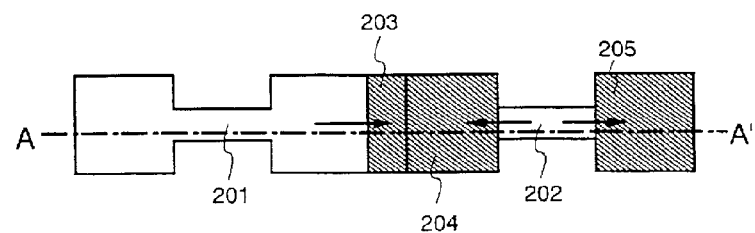
FIGS. 2A to 2F are diagrams explaining the gettering process steps according to the present invention.
Figure 2B:
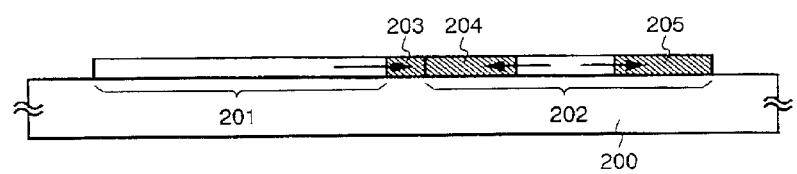

Other structures are explained with reference to FIGS. 2A to 2F. FIGS. 2A to 2F show a manufacturing process of an n-channel TFT and a p-channel TFT adjacent to each other. FIG. 2A shows a top view of a gettering step, and FIG. 2B shows a cross sectional view taken along the line A–A' of FIG. 2A.

In this structure, first, active layers 201 and 202 are crystallized using the catalyst element, and further the periodic table group 15 element is selectively doped to form gettering sinks 203, 204 and 205. The heating process is performed in nitrogen atmosphere and the catalyst element included in the active layers 201 and 202 is gettered to the gettering sink 203 or 204 (FIG. 2B).

The gettering sinks 204 and 205 are a source region and a drain region of the active layer 202, and since the gettering sink 203 is formed in the region sandwiched by the active layers 201 and 202, the area efficiency of the active layer is not lowered.

Figure 2C:
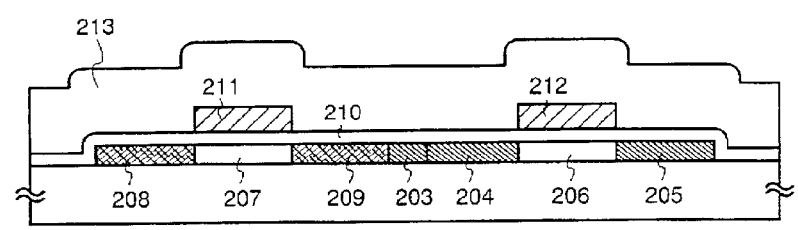

Next, a gate insulating film 210, gate wirings 211 and 212, and a first interlayer insulating film 213 are formed. At this time, a channel region 207, a source region 208 and a drain region 209 are formed in the active layer 201, and similarly a channel region 206, the source region 205 and the drain region 204 are formed in the active layer 202 (FIG. 2C).

Figure 2D:
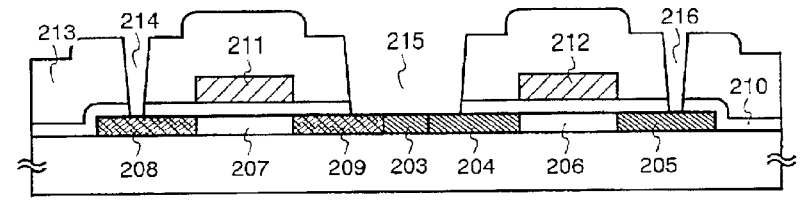

Further, the first interlayer insulating film 213 and the gate insulating film 210 are etched, and through-hole portions (opening portions) 214 to 216 are formed for electric contact to the source regions 205 and 208 or the drain regions 204 and 209 (FIG. 2D).

Figure 2E:
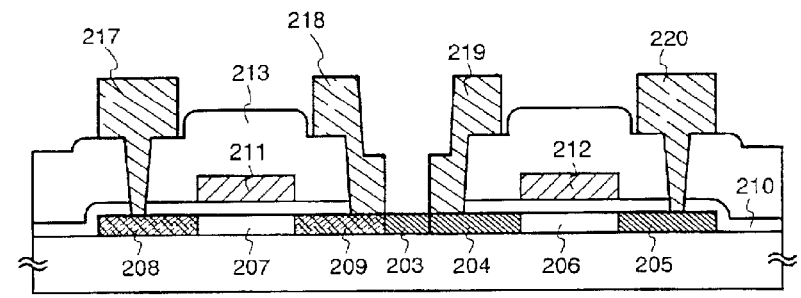
Figure 2F:
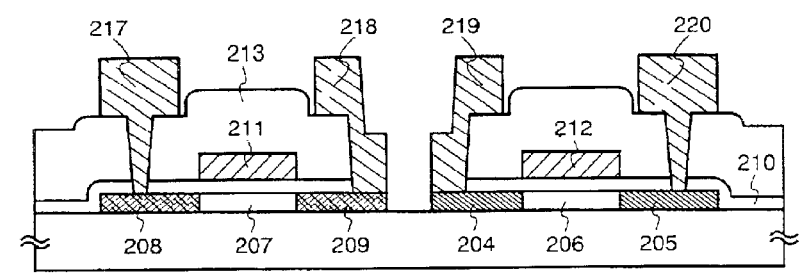
Figure 3A:
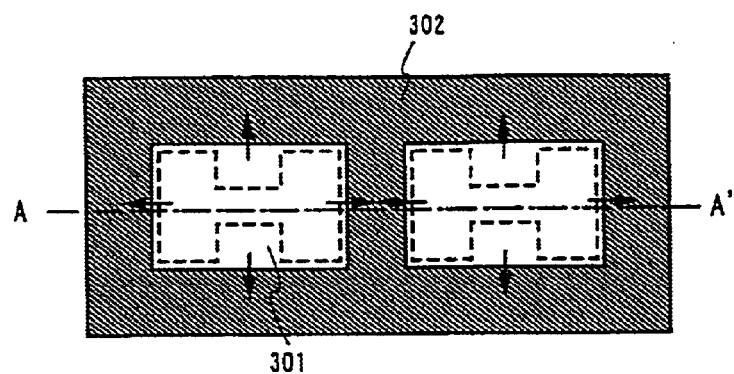
FIGS. 3A and 3B are a top view and a cross sectional view, respectively, of a conventional gettering region.
Figure 3B:
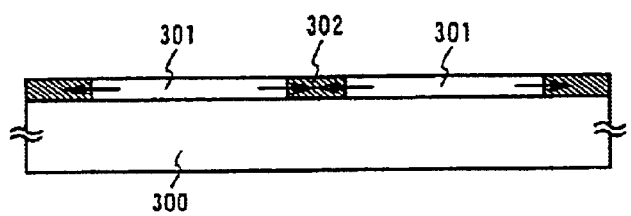
Figure 4A:
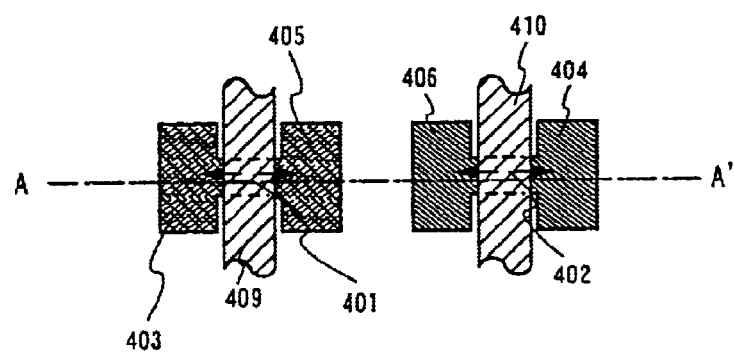
FIGS. 4A and 4B are a top view and a cross sectional view, respectively, of the conventional gettering region.
Figure 4B:
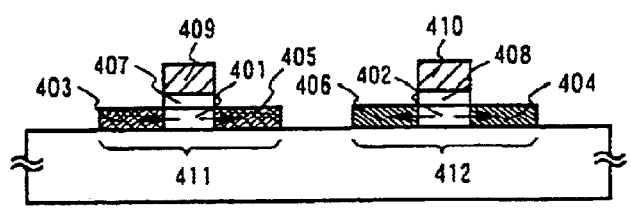

Further, the source wirings 217 and 220 as well as the drain wirings 218 and 219 are formed (FIG. 2E). Then, the gettering sink 203 is etched and removed in a self-aligning manner with the drain wirings 218 and 219 as the masks. By this etching step, portions of the end faces of the wirings 218 and 219 and the end faces of the active layers 201 and 202 are matched (FIG. 2F).

In this structure, by removing the gettering sink 203 in a self-aligning manner, the alignment margin of patterning may be minimized, to perform gettering without lowering the area efficiency. Further, since the cross-doping step is unnecessary, the throughput of the doping step is improved.

The present invention may be implemented to a process (step) for removing the catalyst element from the inside of the crystalline silicon film crystallized by using the catalyst element. Further, the present invention may be implemented to a technique of forming an element which includes such a process.

Specifically, when forming a semiconductor element such as a TFT on a substrate, the present invention may be implemented. Of course, the present invention may also be implemented when manufacturing a liquid crystal display device with the semiconductor element formed on the substrate.

Embodiment 1

An embodiment of the present invention is explained with reference to FIGS. 5A to 7D. The method of simultaneously manufacturing, a pixel portion of a liquid crystal display device and a TFT of a driver circuit provided in the periphery thereof will be described. However, to simplify the explanation, in the driver circuit, an n-channel TFT which forms a CMOS circuit and a transfer gate which are basic circuits of such as a shift register and a buffer is shown.

Figure 5A:
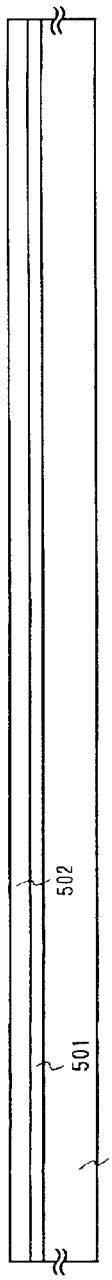
FIGS. 5A to 5F are diagrams showing manufacturing steps of a pixel portion of Embodiment 1.

In FIG. 5A, a glass substrate and a quartz substrate may be used as a substrate 500. In addition, a silicon substrate, a metallic substrate or a stainless substrate with the surface on which an insulating film is formed may be used as a substrate. A plastic substrate may be used if its heat resistance is permitted.

On the surface of the substrate 500 with the TFT formed thereon, a base film 501 made of an insulating film including silicon is formed. In this embodiment, as the base film 501, a silicon oxide nitride film with a thickness of 200 nm is formed.

Next, an amorphous semiconductor film (an amorphous silicon film in this embodiment) 502 with a thickness of 20 to 100 nm is continuously formed on the base film 501 by a known film forming method. Note that, as an amorphous semiconductor film, other than the amorphous silicon film, an amorphous compound semiconductor film such as an amorphous silicon germanium film may be used.

Then, a semiconductor film that includes a crystalline structure (a crystalline silicon film in this embodiment) 503 is formed according to the technique as disclosed in Japanese Patent Application Laid-open No. Hei 7-130652. The technique in this publication is a crystallization means using a catalyst element (one or a plurality of elements selected from the group consisting of nickel, cobalt, germanium, tin, lead, palladium, iron, and copper, typically nickel) promotes crystallization when the amorphous silicon film is crystallized.

Specifically, heat processing is performed in a state the catalyst element is held on the surface of the amorphous silicon film, to change the amorphous silicon film to a crystalline silicon film. In this embodiment, a technique described in Embodiment 1 of the publication is used, but a technique described in Embodiment 2 may be used. Note that, a single crystal silicon film and a polycrystalline silicon film are included in crystalline silicon films, but the crystalline silicon film formed in this embodiment is a silicon film with a crystal grain boundary.

Further, as a method of adding the catalyst element to the amorphous silicon film, the plasma doping method, evaporation method, vapor-phase method such as sputtering, or method of applying a solution including the catalyst element may be used. The method of using the solution is easy in controlling the adding amount of the catalyst element, and facilitates adding in minute amounts.

Although depending on the amount of hydrogen included, the amorphous silicon film is preferably heated for a few hours at 400 to 550° C. and then dehydrogenated, and desirably performed with the crystallization step with the hydrogen amount included of 5 atom % or less. Further, the amorphous silicon film may be formed by other manufacturing methods such as a sputtering method and evaporation method, but it is preferable that impurity elements such as oxygen and nitrogen that are included in the film are sufficiently reduced.

Figure 5B:
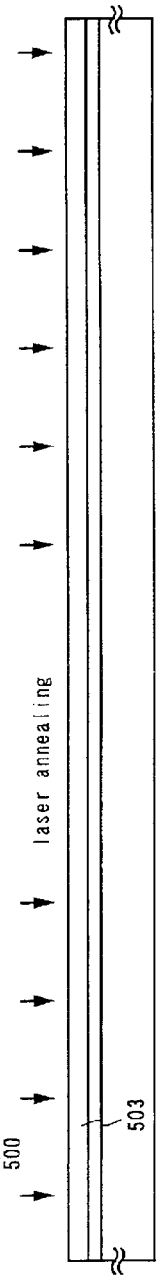

Next, the light emitted from a laser (laser light) is irradiated to the crystalline silicon film 503 (FIG. 5B). As a laser, an excimer laser of a continuous oscillation type or a pulse oscillation type may be used, and an argon laser of a continuous oscillation type may also be used. Further, second harmonic, third harmonic or fourth harmonic of an Nd:YAG laser or a Nd:YVO$_4$ laser may be used. Further, the beam shape of the laser light may be a linear shape (including a rectangular shape) or a square shape.

Further, the light emitted from a lamp (lamp light) may be irradiated instead of the laser light (hereinafter, referred to as lamp anneal). Lamp light from a halogen lamp, an infrared lamp or the like may be used as the lamp light.

Note that, the step of heat processing (annealing) by laser light or lamp light is called a light annealing step. The light annealing step enables high temperature processing in a short time, so even in a case where a substrate with low heat resistance such as a glass substrate is used, an effective heat processing step with high throughput may be performed. Of course, the object is to anneal so that furnace annealing (also referred to as heat annealing) using an electrical furnace may be used instead.

In this embodiment, a laser annealing step is performed by processing the pulse oscillation type excimer laser light into a linear shape. The laser anneal conditions are XeCl gas as an excitation gas, room temperature as the processing temperature, laser energy density 250 to 500 mJ/cm$^2$ (typically 350 to 400 mJ/cm$^2$) with shot numbers between 5 to 10.

The laser annealing step performed with the above conditions, has the effect of crystallizing completely the amorphous region remaining after the thermal crystallization, and reducing the defect of the crystalline region already crystallized. For that reason, this step is a step for improving the crystallinity of the semiconductor film by light annealing, or a step for promoting crystallization of the semiconductor film. This kind of effect may also be obtained by optimizing the lamp annealing conditions.

Next, a protective film 504 for adding the impurity is formed on the crystalline silicon film 503. As the protective film 504, a silicon oxide nitride film or a silicon oxide film with a thickness of 100 to 200 nm (preferably 130 to 170 nm) is used. This protective film 504 is for not exposing the crystalline silicon film 503 directly to plasma when doping impurity, and for making it possible to minutely control density.

Subsequently, an impurity element for selectively imparting a p-type conductivity (hereinafter referred to as a p-type impurity element) is added using a resist mask 505 through the protective film 504. As the p-type impurity element, the periodic table group 13 element, typically boron or gallium may be used. This step (referred to as a channel doping step) is a step for controlling the threshold voltage of the TFT. Note that, here diborane ($B_2H_6$) is not mass separated but doped with boron by an ion doping method with plasma excitation. Of course an ion implantation method may be used in which mass separation is performed.

Figure 5C:
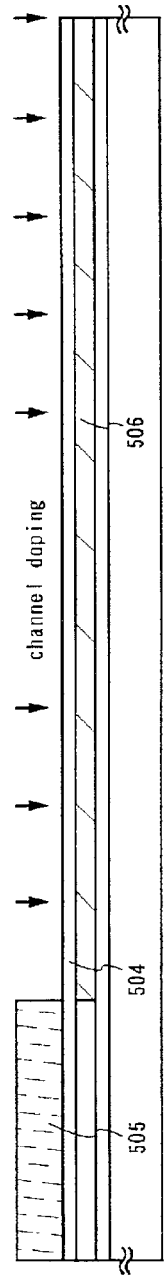

With this step, an impurity region 506 including the p-type impurity element (boron in this embodiment) with a density of $1 \times 10^{15}$ to $1 \times 10^{18}$ atoms/cm$^3$ (typically $5 \times 10^{16}$ to $5 \times 10^{17}$ atoms/cm$^3$) is formed. Note that, throughout this specification, the impurity region including the p-type impurity element is defined as a p-type impurity region (b) at least in the above density range (FIG. 5C).

Figure 5D:
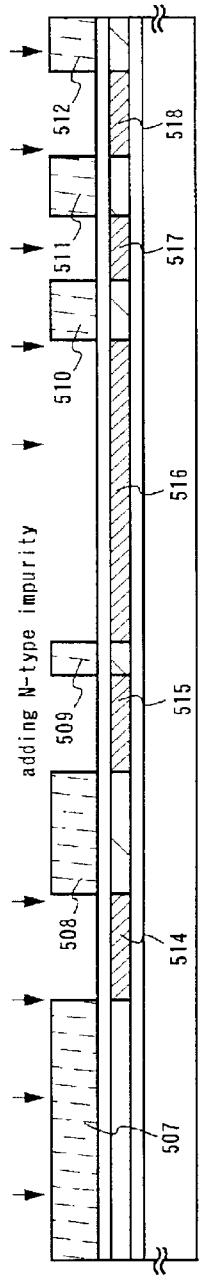

Next, the resist mask 505 is removed, and new resist masks 507 to 512 are formed. Then, impurity regions 514 to 518 with an n-type conductivity are formed by adding the impurity elements imparting the n-type conductivity (hereinafter referred to as an n-type impurity element). Note that, as the n-type impurity element, the periodic table group 15 element, typically phosphorous or arsenic may be used (FIG. 5D).

This low density impurity regions 514 to 518 are impurity regions that function as LDD regions in the n-channel TFT formed later. Note that, the impurity regions 514 to 518 formed here includes the n-type impurity elements at a density of $2\times10^{16}$ to $5\times10^{19}$ atoms/cm$^3$ (typically $5\times10^{17}$ to $5\times10^{18}$ atoms/cm$^3$). Throughout this specification, the impurity region including the n-type impurity element with the above density range is defined as the n-type impurity region (b).

Note that, here phosphorous is added at a density of $1\times10^{18}$ atoms/cm$^3$ with an ion doping method of not mass-separated phosphine (PH$_3$) with plasma excitation. Of course, the ion implantation method in which mass separation is performed may be used. In this step, phosphorous is added to the crystalline silicon film through the protective film 504.

Figure 5E:
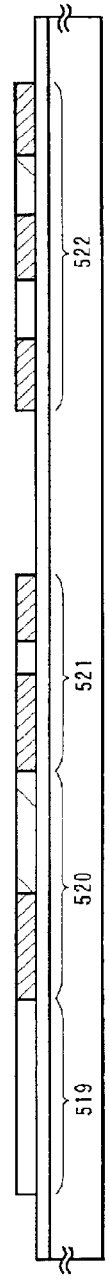

Next, after the protective film 504 is removed, the unnecessary portions of the crystalline silicon film are removed to form island-shape semiconductor films (hereinafter called active layers) 519 to 522 (FIG. 5E).

Resist masks 523 to 527 are formed. Then, impurity regions 528 to 533 including n-type impurity elements with high density are formed by adding the n-type impurity elements. As an n-type impurity element, a phosphorus high in the effect of gettering to nickel which is added as the catalyst element is used. Here, an ion doping method using phosphine (PH$_3$) (of course it may be an ion implantation method) is performed, and the density of phosphorus in this region is $1\times10^{20}$ to $1\times10^{21}$ atoms/cm$^3$ (typically $2\times10^{20}$ to $5\times10^{21}$ atoms/cm$^3$). Note that, in this specification, in the impurity region including the n-type impurity elements in the above density range is defined as an n-type impurity region (a) (FIG. 5F).

Thereafter, the resist masks 523 to 527 are removed, and the catalyst element is conducted with a heat processing step for gettering. This step may be performed with the furnace annealing, the laser annealing, or the rapid thermal annealing (RTA method). The heat processing step is performed with the furnace annealing here. The heating process is performed at 300 to 650° C. in a nitrogen atmosphere, preferably at 400 to 550° C. Here, 4 hours of heat processing is performed at 550° C. (FIG. 6A).

Figure 5F:
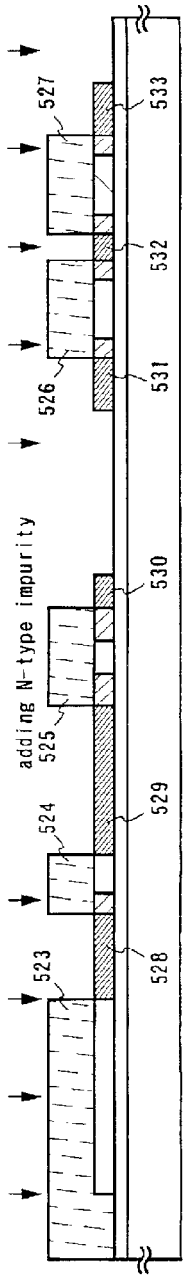

The catalyst element (nickel in this embodiment) used for crystallization of the amorphous silicon film in this embodiment moves to the direction indicated by the arrow, and is captured (gettered) in the regions 528 to 533 which include the high concentration of phosphorous formed in the above step of FIG. 5F. This is a phenomenon that arises from a gettering effect of a metallic element by phosphorous, and as a result channel forming regions 570 to 574 later have the catalyst element with a concentration of $5\times10^{17}$ atoms/cm$^3$ or less (preferably $1\times10^{16}$ atoms/cm$^3$ or less).

On the other hand, the region which becomes the gettering sink of the catalyst element (the impurity regions 528 to 533 formed in the step of FIG. 5F) is segregated with catalyst elements at a high concentration to exist at a concentration of $5\times10^{18}$ atoms/cm$^3$ or more (typically $1\times10^{19}$ to $5\times10^{20}$ atoms/cm$^3$).

Next, the gate insulating film 530 is formed covering the active layers 519 to 522. The gate insulating film 530 is formed with a thickness of 10 to 200 nm, preferably 50 to 150 nm. In this embodiment, the silicon oxide nitride film formed from N$_2$O and SiH$_4$ as raw materials is formed with a thickness of 115 nm by the plasma CVD method (FIG. 6B).

Next, as gate wirings 535 to 538, a two-layer lamination film not shown is formed with tungsten nitride (WN) with a thickness of 50 nm and tantalum (Ta) with a thickness of 350 nm (FIG. 6B). The gate wiring may be formed of a single layer conductive film, but it is preferable to make it as a two or three layer lamination film as the need arises.

Further, in this embodiment, as shown in FIG. 6B, a pixel circuit is of a double gate structure. A multi-gate system may be effectively used as a countermeasure against a leak of a gate. Note that, as the gate wiring, an element selected from the group consisting of tantalum (Ta), titanium (Ti), molybdenum (Mo), tungsten (W), chromium (Cr), and silicon (Si), or an alloy film of the combination of the above elements (typically an Mo—W alloy, a Mo—Ta alloy) may be used.

Next, a resist mask 540 is formed and the p-type impurity element (in this embodiment, boron) is added in a self aligning manner with the gate wiring 535 as a mask. Impurity regions 541 and 542 formed in this way are adjusted to be added with boron at a density 5 to 10 times higher (typically, $1\times10^{16}$ to $5\times10^{18}$ atoms/cm$^3$, generally $3\times10^{17}$ to $3\times10^{18}$ atoms/cm$^3$) than the density of boron added in the channel doping step. Note that, in this specification, the impurity region including the p-type impurity element in the above density range is defined as a p-type impurity region (a) (FIG. 6C).

Next, after the resist mask 540 is removed, a first interlayer insulating film 543 is formed. The first interlayer insulating film 543 may be formed of an insulating film including silicon, specifically a silicon nitride film, a silicon oxide film, a silicon oxide nitride film or a laminated film of the combination of the above films. Further, the film thickness may be 600 nm to 1.5 μm. In this embodiment, a silicon oxide nitride film with a thickness of 1 μm is used, with raw material gas of SiH$_4$, N$_2$O and NH$_3$ by the plasma CVD method (however, the nitrogen density is 25 to 50 atomic %).

Thereafter, the n-type and p-type impurity elements doped with the respective densities are heat processed for activation. This step may be performed with the furnace annealing, the laser annealing, or the rapid thermal annealing (RTA method). The furnace annealing is used for the activation step here. The heating process is performed in a nitrogen atmosphere at 300 to 650° C., preferably at 400 to 550° C. Here heat processing is performed at 550° C. for 4 hours (FIG. 6D). Further, in an atmosphere including 3 to 100% hydrogen, heat processing is performed for 1 to 12 hours at 300 to 450° C., to perform a step for hydrogenating the active layer. This step is for terminating the dangling bonds in the semiconductor layer by thermally excited hydrogen. As other means of hydrogenation, plasma hydrogenation (using hydrogen excited by plasma) may be performed.

Thereafter, through-holes 545 to 550 that reach the source region and the drain region of the TFT are formed (FIG. 6E), to thereby form source wirings 551 to 554 and drain wirings 555 to 558 (FIG. 7A). Further, although not shown, in this embodiment, those wirings are lamination films with a three-layer structure formed by continuous sputtering of a Ti film of 100 nm, an aluminum film including Ti of 300 nm, and a Ti film of 150 nm. Then the source wirings and the drain wirings 551 to 558 are connected to a region added with n-type impurity elements of the active layer at a density of $1\times10^{20}$ to $1\times10^{21}$ atoms/cm$^3$.

Next the unnecessary portions of the crystalline silicon film are removed in a self-aligning manner with the wirings 552 and 555 to 557 as masks, to separate and form the active layers 519 to 521 (FIG. 7B). Since the active layers 519 to 521 are separated and formed by etching in a self-aligning manner with the wirings as masks, the process margin such as from an error of patterning does not have to be considered so that the area efficiency of the active layer may be improved. With this etching process, a part of the end face of the wiring and the end face of the active layer are aligned.

Next, a passivation film 560 is formed of a silicon nitride film, a silicon oxide film, or a silicon nitride oxide film with a thickness of 50 to 500 nm (typically 200 to 300 nm). At this time, in this embodiment, before the formation of film, plasma processing is performed using gas including hydrogen such as $H_2$ and $NH_3$, then after the film formation, heat processing is performed. The hydrogen excited in the pre-processing is supplied to the first interlayer insulating film and a heat processing is performed, to thereby improve the film quality of the passivation film 560 as well as disperse the hydrogen added to the first interlayer insulating film to a lower side. Therefore, hydrogenation of the active layer is effectively performed (FIG. 7C).

After the passivation film 560 is formed, the hydrogenation step may be further performed. For example, in an atmosphere including 3 to 100% hydrogen, it is preferable that heat processing is performed for 1 to 12 hours at 300 to 450° C., and the same effect may be obtained using a plasma hydrogenation method. Note that the opening portion of the passivation film 560 may be formed at the position where through-holes are formed to connect a pixel electrode 564 and the drain wiring 558.

Next, a second interlayer insulating film 561 formed of an organic resin is formed on the passivation film 560 with a thickness of approximately 1 µm. As the organic resin, polyimide, acrylic resin, polyamide, polyimideamide, BCB (benzocyclobutene) and the like may be used. The advantage in using the organic resin film is in that the film forming method is simple, the relative dielectric constant is low so that the parasitic capacitance may be reduced, and the flatness property is excellent. Note that, organic resin films other than the above and organic SiO compounds may be used. Here, after application onto the substrate, the polyimide of thermal polymerization type is used and is burned at 300° C. to form the second interlayer insulating film 561.

Next, in a region to become a pixel portion, a shielding film 562 is formed on the second interlayer insulating film 561. Note that, in this specification, the word, a shielding film is used to mean that the film shields against light and electromagnetic waves. The shielding film 562 is a film made from the element selected from the group consisting of aluminum (Al), titanium (Ti), and tantalum (Ta) or a film with any of the elements as a main component and is formed with a thickness of 100 to 300 nm. In this embodiment, an aluminum film including 1 wt % of titanium is formed with a thickness of 125 nm.

Although not shown, if an insulating film such as a silicon oxide film with a thickness of 5 to 50 nm is formed on the second interlayer insulating film 561, the adherence of the shielding film to be formed on this is improved. Further, if plasma processing using $CF_4$ gas is performed on a surface of the second interlayer insulating film 561 formed of organic resin, the adherence with the shielding film 562 formed on the film is improved by the reformed surface.

Further, by using the aluminum film including titanium, not only a shielding film but other connection wirings may be formed. For example, connection wirings for connecting circuits within the driver circuit may be formed. However, in such a case, before film formation of the material to form a shielding film or a connecting wiring, the through-holes need to be formed in advance in the second interlayer insulating film 561.

After that, a third interlayer insulating film 563 formed of organic resin is formed with a thickness of approximately 0.5 µm. Similarly to the second interlayer insulating film 561, as an organic resin, polyimide, acryl, polyimide, polyimideamide, BCB (benzocyclobutene) and the like may be used. Further, organic resin films other than those described above and organic SiO compounds may be used. Here, after application to the substrate, a polyimide of thermal polymerization type is used and is burned at 300° C. to form the third interlayer insulating film 563.

Next, through-holes that reach the drain wiring 558 are formed in the third interlayer insulating film 563, the second interlayer insulating film 561 and the passivation film 560, and pixel electrodes 564 and 565 are formed. The pixel electrodes 564 and 565, respectively, are separate pixel electrodes of pixels adjacent to each other. In a case the pixel electrodes 564 and 565 are to be a transmission type liquid crystal display device, a transparent conductive film is used, and in a case the pixel electrodes 564 and 565 are to be a reflection type liquid crystal display device, a metallic film is used. Here, for a transmission type liquid crystal display device, an ITO (indium tin oxide) film is formed by sputtering with a thickness of 110 nm (FIG. 7D).

In this way, an active matrix substrate having a driver circuit and a pixel portion is formed on the same substrate. Note that, in FIG. 7D, a p-channel TFT 566 and n-channel TFTs 567 and 568 are formed in the driver circuit, and a pixel TFT 569 formed of an n-channel TFT is formed in the pixel portion.

Embodiment 2

Figure 8:
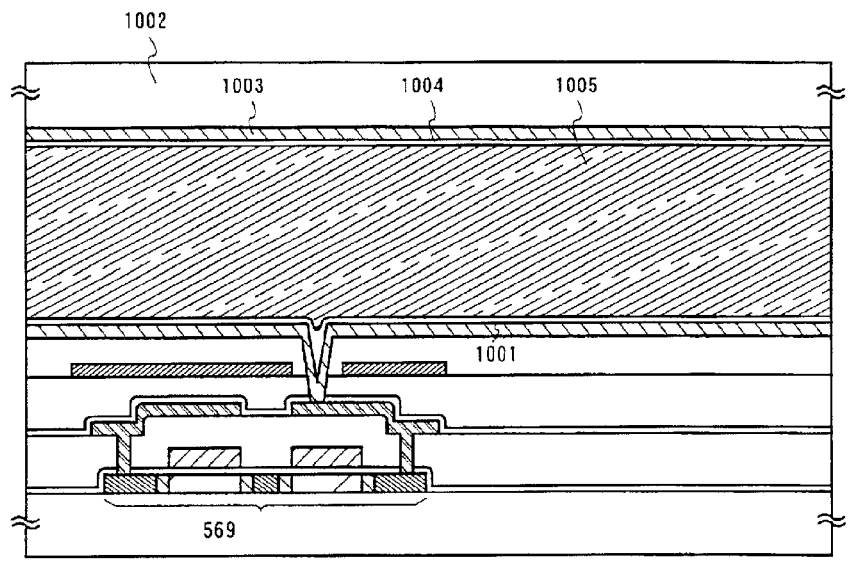
FIG. 8 is a cross sectional view of an active matrix liquid crystal display device.

In this embodiment, the process of manufacturing an active matrix liquid crystal display device from the active matrix substrate manufactured in Embodiment 1 is explained. As shown in FIG. 8, an orientation film 1001 is formed on the substrate in the state shown in FIG. 7D. In this embodiment, as an orientation film, a polyimide film is used. Further, an opposing substrate 1002 is formed with an opposing electrode 1003, and an orientation film 1004. Note that, a color filter or a shielding film may be formed on the opposing substrate if necessary.

Next after forming the orientation film, the liquid molecules are oriented with a given pre-tilted angle by a rubbing processing. Then, the active matrix formed with a pixel circuit and a driver circuit and the opposing substrate are bonded together by a known cell assembling step through a sealing member or a spacer (both not shown). Thereafter, a liquid crystal 1005 is injected between both the substrates, to completely seal with a sealing agent (not shown). As liquid crystal, a known liquid crystal material may be used. In this way an active matrix liquid crystal display device shown in FIG. 8 is completed.

Figure 9:
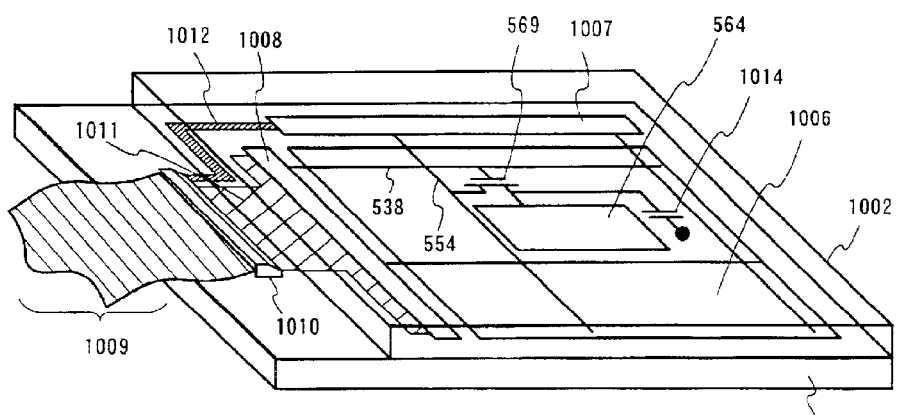
FIG. 9 is a perspective view of an active matrix liquid crystal display device.

Next, the structure of this active matrix liquid crystal display device is described with reference to the perspective view shown in FIG. 9. Note that, in FIG. 9, the same reference symbols are used to correspond to the cross sectional views of FIGS. 5A to 7D. The active matrix substrate is structured by a pixel portion 1006, a gate signal driver circuit 1007 and an image (source) signal driver circuit 1008 formed on the glass substrate 500. The pixel TFT 569 is an n-channel TFT and the driver circuit provided in the periphery thereof is structured with the CMOS circuit as the basis. The gate signal driver circuit 1007 and the image signal driver circuit 1008 are connected to the pixel portion 1006 by the gate wiring 538 and the source wiring 554, respectively. Further, from an external input/output terminal 1010 connected with an FPC 1009 to the input/output terminal of the driver circuit is provided connection wirings 1011 and 1012.

Embodiment 3

The liquid crystal display device manufactured by employing the present invention may be used as a display portion of electric equipment. As such electric equipments, there are given a video camera, a digital camera, a projector, a projection TV, a goggle type display (head mount display), a note type personal computer, a game device, a portable information terminal (such as a mobile computer, a portable phone, a portable type game device or an electronic book), an image playback device having a recording medium, and the like. Specific examples of such electric equipments are given in FIGS. 10A to 10F.

FIG. 10A shows a portable telephone that is composed of a main body 2001, a voice output portion 2002, a voice input portion 2003, a display portion 2004, operating switches 2005, and an antenna 2006. The liquid crystal display device of the present invention may be used in the display portion 2004.

FIG. 10B shows a video camera that is composed of a main body 2101, a display portion 2102, a sound input portion 2103, operation switches 2104, a battery 2105, and an image receiving portion 2106. The liquid crystal display device of the present invention may be used in the display portion 2102.

FIG. 10C shows a mobile computer that is composed of a main body 2201, a camera portion 2202, an image receiving portion 2203, an operating switch 2204 and a display portion 2205. The liquid crystal display device of the present invention may be used in the display portion 2205.

FIG. 10D shows a goggle type display that is composed of a main body 2301, display portions 2302 and arm portions 2303. The liquid display device of the present invention may be used as the display portions 2302.

FIG. 10E shows a rear projector (projection TV) which is composed of a main body 2401, a light source 2402, a display device 2403, a polarized light beam splitter 2404, reflectors 2405, 2406, and a screen 2407. The present invention may be applied to the display device 2403.

FIG. 10F shows a front projector which is composed of a main body 2501, a light source 2502, a display device 2503, an optical system 2504 and a screen 2505. The present invention may be applied to the display device 2503.

As described above, the application range of the present invention is extremely wide, and may be applied to electric equipments in all fields. Further, the electronic equipments of this embodiment may be realized by using structures of Embodiments 1 and 2 in any combination.

BY manufacturing an active matrix substrate by using the present invention, it is possible to perform gettering in a process with high area efficiency and high throughput. Accordingly, it is possible to manufacture the liquid crystal display device which has high accumulation of TFT, high productivity and high reliability.

Further, by manufacturing a liquid crystal display device using the present invention, it is possible to improve the quality and reliability of electronic equipments using the liquid crystal display device as the display portion.

What is claimed is:

1. A semiconductor device comprising:
at least one p-channel thin film transistor and at least one n-channel thin film transistor, each comprising:
an active layer comprising a pair of impurity regions and a channel region between the pair of impurity regions over an insulating surface;
a gate insulating film over the active layer; and
a gate electrode over the gate insulating film,
a first insulating film over the thin film transistor;
first and second wirings connected to the active region through contact holes in the first insulating film,
a second insulating film over the first insulating film;
wherein a part of an edge portion of at least one of first and second wirings is aligned with at least one edge portion of the active layer,
wherein the gate insulating film is in contact with the first and second wirings and not in contact with the at least one edge portion of the active layer, and
wherein a concentration of a catalyst element in the active layer of the at least one p-channel thin film transistor is lower than that of the at least one n-channel thin film transistor.

2. A semiconductor device comprising:
at least one p-channel thin film transistor and at least one n-channel thin film transistor, each comprising:
an active layer comprising a pair of impurity regions and a channel region between the pair of impurity regions over an insulating surface;
a gate insulating film over the active layer; and
a gate electrode over the gate insulating film,
a first insulating film over the thin film transistor;
first and second wirings connected to the active region through contact holes in the first insulating film,
a second insulating film over the first insulating film;
wherein a part of an edge portion of one of the first and second wirings is aligned with an edge of the active layer,
wherein the gate insulating film is in contact with the first and second wirings and not in contact with the edge of the active layer, and
wherein the second insulating film is in contact with the insulating surface, and
wherein a concentration of a catalyst element in the pair of impurity regions of the at least one p-channel thin film transistor is lower than that of the at least one n-channel thin film transistor.

3. A semiconductor device comprising:
at least one p-channel thin film transistor and at least one n-channel thin film transistor, each comprising:
an active layer comprising a pair of impurity regions and a channel region between the pair of impurity regions over an insulating surface;
a gate insulating film over the active layer; and
a gate electrode over the gate insulating film,
a first insulating film over the thin film transistor;
first and second wirings connected to the active region through contact holes in the first insulating film,
a second insulating film over the first insulating film;
wherein a part of an edge portion of the first wiring is aligned with one of edge portions of the active layer, and a part of an edge portion of the second wiring is aligned with another one of the edge portions of the active layer,
wherein the gate insulating film is in contact with the first and second wirings and not in contact with the edge portions of the active layer, and
wherein the second insulating film is in contact with the insulating surface, and
wherein a concentration of a catalyst element in the pair of impurity regions of the at least one p-channel thin film transistor is lower than that of the at least one n-channel thin film transistor.

4. A semiconductor device according to claim 1, wherein the semiconductor device is a device selected from the group consisting of a portable telephone, a video camera, a mobile computer, a goggle type display, a rear projector and a front projector.

5. A semiconductor device according to claim 2, wherein the semiconductor device is a device selected from the group consisting of a portable telephone, a video camera, a mobile computer, a goggle type display, a rear projector and a front projector.

6. A semiconductor device according to claim 3, wherein the semiconductor device is a device selected from the group consisting of a portable telephone, a video camera, a mobile computer, a goggle type display, a rear projector and a front projector.

7. A semiconductor device according to claim 1, wherein the second insulating film comprises a material selected from the group consisting of silicon nitride, silicon oxide and silicon nitride oxide.

8. A semiconductor device according to claim 2, wherein the second insulating film comprises a material selected from the group consisting of silicon nitride, silicon oxide and silicon nitride oxide.

9. A semiconductor device according to claim 3, wherein the second insulating film comprises a material selected from the group consisting of silicon nitride, silicon oxide and silicon nitride oxide.

10. A semiconductor device according to claim 1, wherein the catalyst element is selected from the group consisting of Ni, Co, Fe, Pd, Pt, Cu and Au.

11. A semiconductor device according to claim 2, wherein the catalyst element is selected from the group consisting of Ni, Co, Fe, Pd, Pt, Cu and Au.

12. A semiconductor device according to claim 3, wherein the catalyst element is selected from the group consisting of Ni, Cc, Fe, Pd, Pt, Cu and Au.

13. A semiconductor device comprising:
at least one p-channel thin film transistor and at least one n-channel thin film transistor, each comprising:
an active layer comprising a pair of impurity regions and a channel region between the pair of impurity regions over an insulating surface;
a gate insulating film over the active layer; and
a gate electrode over the gate insulating film,
a first insulating film over the thin film transistor;
first and second wirings connected to the active region through contact holes in the first insulating film,
a second insulating film over the first insulating film;
wherein a part of an edge portion of at least one of first and second wirings is aligned with at least one edge portion of the active layer, and
wherein a concentration of a catalyst element in the active layer of the at least one p-channel thin film transistor is lower than that of the at least one n-channel thin film transistor.

14. A semiconductor device comprising:
at least one p-channel thin film transistor and at least one n-channel thin film transistor, each comprising:
an active layer comprising a pair of impurity regions and a channel region between the pair of impurity regions over an insulating surface;
a gate insulating film over the active layer; and
a gate electrode over the gate insulating film,
a first insulating film over the thin film transistor;
first and second wirings connected to the active region through contact holes in the first insulating film,
a second insulating film over the first insulating film;
wherein a part of an edge portion of one of the first and second wirings is aligned with an edge of the active layer, and
wherein a concentration of a catalyst element in the pair of impurity regions of the at least one p-channel thin film transistor is lower than that of the at least one n-channel thin film transistor.

15. A semiconductor device comprising:
at least one p-channel thin film transistor and at least one n-channel thin film transistor, each comprising:
an active layer comprising a pair of impurity regions and a channel region between the pair of impurity regions over an insulating surface;
a gate insulating film over the active layer; and
a gate electrode over the gate insulating film,
a first insulating film over the thin film transistor;
first and second wirings connected to the active region through contact holes in the first insulating film,
a second insulating film over the first insulating film;
wherein a part of an edge portion of the first wiring is aligned with one of edge portions of the active layer, and a part of an edge portion of the second wiring is aligned with another one of the edge portions of the active layer, and
wherein a concentration of a catalyst element in the pair of impurity regions of the at least one p-channel thin film transistor is lower than that of the at least one n-channel thin film transistor.

16. A semiconductor device according to claim 13, wherein the semiconductor device is a device selected from the group consisting of a portable telephone, a video camera, a mobile computer, a goggle type display, a rear projector and a front projector.

17. A semiconductor device according to claim 14, wherein the semiconductor device is a device selected from the group consisting of a portable telephone, a video camera, a mobile computer, a goggle type display, a rear projector and a front projector.

18. A semiconductor device according to claim 15, wherein the semiconductor device is a device selected from the group consisting of a portable telephone, a video camera, a mobile computer, a goggle type display, a rear projector and a front projector.

19. A semiconductor device according to claim 13, wherein the second insulating film comprises a material selected from the group consisting of silicon nitride, silicon oxide and silicon nitride oxide.

20. A semiconductor device according to claim 14, wherein the second insulating film comprises a material selected from the group consisting of silicon nitride, silicon oxide and silicon nitride oxide.

21. A semiconductor device according to claim 15, wherein the second insulating film comprises a material selected from the group consisting of silicon nitride, silicon oxide and silicon nitride oxide.

22. A semiconductor device according to claim 13, wherein the catalyst element is selected from the group consisting of Ni, Co, Fe, Pd, Pt, Cu and Au.

23. A semiconductor device according to claim 14, wherein the catalyst element is selected from the group consisting of Ni, Co, Fe, Pd, Pt, Cu and Au.

24. A semiconductor device according to claim 15, wherein the catalyst element is selected from the group consisting of Ni, Co., Fe, Pd, Pt, Cu and Au.

25. A semiconductor device comprising:

at least one p-channel thin film transistor and at least one n-channel thin film transistor, each comprising:

an active layer comprising a pair of impurity regions and a channel region between the pair of impurity regions over an insulating surface;

a gate insulating film over the active layer; and a gate electrode over the gate insulating film, a first insulating film over the thin film transistor;

first and second wirings connected to the active region through contact holes in the first insulating film, a second insulating film over the first insulating film;

wherein a part of an edge portion of at least one of first and second wirings is aligned with at least one edge portion of the active layer, wherein the gate insulating film is in contact with the first and second wirings and not in contact with the at least one edge portion of the active layer, and wherein the pair impurity regions of the at least one n-channel thin film transistor have a catalyst element in a concentration of $5 \times 10^{18}$ atoms/cm$^3$ or more.

26. A semiconductor device comprising:

at least one p-channel thin film transistor and at least one n-channel thin film transistor, each comprising:

an active layer comprising a pair of impurity regions and a channel region between the pair of impurity regions over an insulating surface;

a gate insulating film over the active layer; and a gate electrode over the gate insulating film, a first insulating film over the thin film transistor;

first and second wirings connected to the active region through contact holes in the first insulating film, a second insulating film over the first insulating film;

wherein a part of an edge portion of one of the first and second wirings is aligned with an edge of the active layer, wherein the gate insulating film is in contact with the first and second wirings and not in contact with the edge of the active layer, wherein the second insulating film is in contact with the insulating surface, and wherein the pair impurity regions of the at least one n-channel thin film transistor have a catalyst element in a concentration of $5 \times 10^{18}$ atoms/cm$^3$ or more.

27. A semiconductor device comprising:

at least one p-channel thin film transistor and at least one n-channel thin film transistor, each comprising:

an active layer comprising a pair of impurity regions and a channel region between the pair of impurity regions over an insulating surface;

a gate insulating film over the active layer; and a gate electrode over the gate insulating film, a first insulating film over the thin film transistor;

first and second wirings connected to the active region through contact holes in the first insulating film, a second insulating film over the first insulating film;

wherein a part of an edge portion of the first wiring is aligned with one of edge portions of the active layer, and a part of an edge portion of the second wiring is aligned with another one of the edge portions of the active layer, wherein the gate insulating film is in contact with the first and second wirings and not in contact with the edge portions of the active layer, wherein the second insulating film is in contact with the insulating surface, and wherein the pair impurity regions of the at least one n-channel thin film transistor have a catalyst element in a concentration of $5 \times 10^{18}$ atoms/cm$^3$ or more.

28. A semiconductor device according to claim 25, wherein the semiconductor device is a device selected from the group consisting of a portable telephone, a video camera, a mobile computer, a goggle type display, a rear projector and a front projector.

29. A semiconductor device according to claim 26, wherein the semiconductor device is a device selected from the group consisting of a portable telephone, a video camera, a mobile computer, a goggle type display, a rear projector and a front projector.

30. A semiconductor device according to claim 27, wherein the semiconductor device is a device selected from the group consisting of a portable telephone, a video camera, a mobile computer, a goggle type display, a rear projector and a front projector.

31. A semiconductor device according to claim 25, wherein the second insulating film comprises a material selected from the group consisting of silicon nitride, silicon oxide and silicon nitride oxide.

32. A semiconductor device according to claim 26, wherein the second insulating film comprises a material selected from the group consisting of silicon nitride, silicon oxide and silicon nitride oxide.

33. A semiconductor device according to claim 27, wherein the second insulating film comprises a material selected from the group consisting of silicon nitride, silicon oxide and silicon nitride oxide.

34. A semiconductor device according to claim 25, wherein the catalyst element is selected from the group consisting of Ni, Co, Fe, Pd, Pt, Cu and Au.

35. A semiconductor device according to claim 26, wherein the catalyst element is selected from the group consisting of Ni, Co, Fe, Pd, Pt, Cu and Au.

36. A semiconductor device according to claim 27, wherein the catalyst element is selected from the group consisting of Ni, Co, Fe, Pd, Pt, Cu and Au.

* * * * *